United States Patent
Villemazet et al.

(10) Patent No.: US 7,545,211 B2
(45) Date of Patent: Jun. 9, 2009

(54) PREDISTORTION LINEARIZATION DEVICE WITH ADJUSTABLE AMPLITUDE AND SHAPE

(75) Inventors: Jean-Francois Villemazet, Cintegabelle (FR); Jean Maynard, Ramonville (FR); Dominique Geffroy, Leguevin (FR)

(73) Assignee: Thales (FR)

( * ) Notice: Subject to any disclaimer, the term of this patent is extended or adjusted under 35 U.S.C. 154(b) by 0 days.

(21) Appl. No.: 11/966,464

(22) Filed: Dec. 28, 2007

(65) Prior Publication Data

US 2008/0157871 A1 Jul. 3, 2008

(30) Foreign Application Priority Data

Dec. 28, 2006 (FR) .................................. 06 55991

(51) Int. Cl.
H03F 1/26 (2006.01)
(52) U.S. Cl. ........................ 330/149; 330/53; 330/278
(58) Field of Classification Search ................. 330/149, 330/53, 278
See application file for complete search history.

(56) References Cited

U.S. PATENT DOCUMENTS

| | | | |
|---|---|---|---|
| 4,068,186 A | 1/1978 | Sato et al. | |
| 4,109,212 A | 8/1978 | Donnell et al. | |
| 4,992,754 A | 2/1991 | Blauvelt et al. | |
| 5,172,068 A | 12/1992 | Childs | |
| 5,523,716 A * | 6/1996 | Grebliunas et al. | 330/149 |
| 5,966,049 A | 10/1999 | Yuen et al. | |
| 6,788,139 B2 * | 9/2004 | Villemazet et al. | 330/149 |
| 6,809,587 B2 * | 10/2004 | Ghannouchi et al. | 330/149 |
| 7,332,961 B2 * | 2/2008 | Blednov | 330/149 |
| 7,385,447 B1 * | 6/2008 | Adar | 330/149 |
| 2007/0241815 A1 * | 10/2007 | Noto et al. | 330/149 |

FOREIGN PATENT DOCUMENTS

| | | |
|---|---|---|
| EP | 1039630 A1 | 9/2000 |
| EP | 1320190 A1 | 6/2003 |
| FR | 2719954 A1 | 5/1994 |
| FR | 2791197 A1 | 3/1999 |
| FR | 2833431 A1 | 12/2001 |

* cited by examiner

Primary Examiner—Patricia Nguyen
(74) Attorney, Agent, or Firm—Lowe Hauptman Ham & Berner, LLP

(57) ABSTRACT

A predistortion linearization device (D) produces gain and phase expansions making it possible to compensate for the gain compression and phase variation of a power amplifier. This device (D) also allows the conventional adjustment of amplitude, the adjustment of the form of the gain and phase expansions as a function of a microwave input signal (Se).

25 Claims, 4 Drawing Sheets

PREDISTORTION LINEARIZATION DEVICE WITH ADJUSTABLE AMPLITUDE AND SHAPE

RELATED APPLICATIONS

The present application is based on, and claims priority from, French Application Number 06 55991, filed Dec. 28, 2006, the disclosure of which is hereby incorporated by reference herein in its entirety.

FIELD OF THE INVENTION

The invention relates to the field of linearization devices called "predistorters", that are for example used upstream (or at the input) of power amplification devices in order to compensate for their non-linearity or non-linearities.

BACKGROUND OF THE INVENTION

As is known to those skilled in the art, a linearizer is a device that makes it possible to compensate for the gain compression ("AM/AM" for "Amplitude-Amplitude Modulation conversion") of a power amplifier (for example of the HPA (for "High Power Amplifier") type) and the variation of its insertion phase as a function of the incident power ("AM/PM" for "Amplitude-Phase Modulation conversion"). The power amplifiers commonly used in certain fields, such as for example the space field, are either travelling wave tube amplifiers (or TWTAs) or solid state power amplifiers (or SSPAs).

The linearization principle generally used in satellite payloads is predistortion. A predistortion linearizer is a device that is placed upstream of the input of a power amplifier. It must have a gain and phase response as a function of its output power which is the inverse of that of the power amplifier (as a function of its input power) to which it must be coupled, firstly in terms of variation direction (gain expansion instead of gain compression), secondly in terms of variation amplitude (for example +7 dB of gain expansion and +40 degrees of phase expansion in the presence of an amplifier having a saturation compression of −7 dB and of −40 degrees), and thirdly in terms of characteristic form (also called "shape") so as to "closely follow" the whole characteristic of the amplifier and therefore to linearize all its range to take account of the variations of input power and of envelope of the payload signal (for the adjustment of the linearizer, the user reasons with a single carrier signal (CW) but the payload signal carries a modulation and most usually has a non-constant envelope).

It is possible to adjust the amplitude of the gain and phase expansions of a predistortion linearizer so that its response is matched to a power amplifier to be linearized. Unfortunately, the compression and expansion shapes of the linearizer and of the associated amplifier are not identical in most cases and therefore the linearization is imperfect. For example, if the linearizer has a slow gain expansion (that is to say close to a straight line) then the compression of the amplifier is relatively severe (that is to say close to an exponential function), the adjustment of the linearizer, that corresponds to a total compensation to saturation of the amplifier, leads to a high backward overcompensation for the input powers that are lower than the saturation, which generally degrades the linearity over the whole of the power range of the linearized amplifier. In this case, the optimal adjustment is obtained by compensating for not all of the compression of the amplifier so as not to carry out too much backward overcompensation.

Most predistortion linearizers use non-linear elements such as Schottky diodes. The non-linear behaviour in transmission of the linearizer as a function of its input power is then based on a mechanism called self-biasing of the diode in the presence of a high power level RF signal. The evolution of the bias point as a function of the RF power will in effect induce a particular behaviour of the diode in terms of impedance presented to the incident RF signal. Two main types of biasing of the diode may lead to non-linear self-biasing behaviours that differ depending on whether the diode is supplied by a voltage generator through a high value or low value resistor mounted in series.

In the case of biasing through a high value resistor (R), when the power of the input RF signal increases, the current $(I_D)$ that supplies the diode increases and hence the voltage $V_D$ at the terminals of this diode reduces ($V_D = V_{LIN} - RI_D$, $V_{LIN}$ being the supply voltage of the linearizer). Consequently, the current that passes through the diode is substantially constant.

In the case of biasing through a low value resistor (R), when the power of the input RF signal increases, the current that passes through the diode increases because the voltage $V_D$ at the terminals of this diode is substantially constant ($V_D \approx V_{LIN}$).

The diode is then used as an impedance that varies as a function of the input RF power in a linearization circuit responsible for converting this impedance variation into a variation of the transmission parameters of the device of which it forms part. The diode(s) may therefore be used in reflection as a load of a hybrid coupler, or in transmission on a propagation line, or else in series or parallel configuration, for example.

Many devices using the conventional self-biasing non-linear mechanism (described above) have been proposed, they are for example described in patent documents U.S. Pat. Nos. 4,992,754, 4,068,186, FR 2 719 954, FR 2 791 197 and FR 2 833 431.

Unfortunately, this conventional self-biasing non-linear mechanism invariably leads to only one type of curve of the gain and phase expansions of the linearizer and therefore does not make it possible to control the shape (form) of the expansions.

SUMMARY OF THE INVENTION

The object of the invention is therefore to allow the control of the shape of the expansions of a predistortion linearizer in order to significantly enhance the linearization of power amplifiers across their whole range.

Accordingly it proposes a predistortion linearization device with gain and phase expansions to compensate for the gain compression and phase variation of a power amplifier.

This linearization device comprises:
  first division means comprising an input capable of receiving a microwave input signal and first and second outputs responsible for generating first and second fractions chosen from the input signal the said fractions preferably being adjustable,
  a first channel connected to the first output in order to be supplied by the first fraction of the input signal, and arranged to generate a first direct current from a first self-biasing of a first diode as a function of the first fraction of the input signal,
  a second channel connected to the second output in order to be supplied by the second fraction of the input signal, and responsible for carrying out gain and phase expansions at a port forming an output (of the second channel and of the linearization device) from a second self-biasing of at least one second diode as a function of the second fraction of the input signal, and a bias circuit connected to, and supplying with direct voltages, the first and second channels, and responsible for combining, in an opposing manner, the direct voltages and currents originating from the first and second self-biasings of the first and second channels so as to control the shape of the gain and phase expansions of the second channel as a function of the amplitude of the input signal.

The linearization device according to the invention may comprise other features that may be taken separately or in combination, and in particular:

its first channel may comprise a first circuit connected to the first output of the first division means and responsible for supplying at least a first diode with the first fraction of the input signal and for supplying two ports that are insulated from the first fraction of the input signal and making it possible to directly apply direct voltages respectively to the terminals of the first diode;

its second channel may comprise a second circuit connected to the second output of the first division means and responsible, on the one hand, for supplying at least one second diode with at least a portion of the second fraction of the input signal in order to convert an impedance variation of the second diode as a function of the second fraction of the input signal into gain and phase expansions at a port defining an output (of the second channel and of the linearization device), and, on the other hand, for supplying two other ports that are insulated from the second fraction of the input signal and making it possible to directly apply direct voltages respectively to the terminals of the second diode;

its bias circuit may comprise a first direct voltage generator connected to the anode of the first diode through one of the ports of the first channel, and a second direct voltage generator connected simultaneously through a resistor to a common node formed of the cathode of the first diode through the other port of the first channel and of the anode of the second diode through one port of the second channel, the cathode of the second diode being connected, through the other port of the second channel, to earth from the point of view of the direct voltage;

the direction of the first and second diodes may be simultaneously inverted;

its first division means may comprise a coupler responsible for dividing the power of the input signal into two portions, and an element placed downstream of at least one of the two outputs of the coupler and responsible for amplifying or attenuating by a chosen and adjustable quantity the value of the power delivered by each of the two outputs of the coupler, so that the first division means deliver to the first and second outputs respectively the first and second chosen adjustable fractions of the input signal;

the element may for example be chosen from a group comprising a variable attenuator element, an amplifier element, a variable gain amplifier element, and an element linking in cascade several of the functions of the other elements of this group;

the element may have a behaviour that is non-uniform and adjustable as a function of the frequency;

the second circuit may form a diode-based linearization circuit whose direct bias ports comprise no resistor in series with this or these diodes;

the linearization circuit may comprise:

second division means comprising an input connected to the second output of the first division means and first and second outputs responsible for delivering first and second chosen sub-fractions of the second fraction of the input signal, combination means comprising first and second inputs and an output capable of delivering output signals resulting from the combination of the signals received on its first and second inputs, a first sub-channel, called non-linear, comprising a first coupler (preferentially of the Lange coupler type) comprising first and second ports each connected to earth via at least one second diode supplied with direct voltage and current by the second generator through the resistor at the common node (common point), a third port connected to the first output of the second division means, and a fourth port coupled to the first input of the combination means, and a second sub-channel, called linear, comprising a second coupler substantially identical to the first coupler in order to ensure by construction the same group propagation delay for the first and second sub-channels and comprising first and second ports each connected to earth via third passive components, a third port connected to the second output of the second division means, and a fourth port coupled to the second input of the combination means;

the third passive components may be sections of microwave transmission line in open circuit, of adjustable length and width so as to adjust the combination phase of the signals in the combination means, in a substantially constant manner across a whole chosen frequency band;

at least one of the first and second sub-channels may comprise a transmission line of adjustable length, so as to modify the group propagation delay of its sub-channel to adjust the combination phase of the signals in the combination means, in a non-constant manner as a function of the frequency, so that the linearizer has a different behaviour as a function of the frequency on a broad band of frequencies so as to follow the frequency variations of the power amplifier to be linearized;

at least one of the first and second sub-channels may comprise at least one resistor etched in series or in parallel on the transmission line playing the role of attenuator of an attenuation value that is adjustable between a finite value and zero by short-circuiting the series resistor by means of a tape or of at least one metal wire and by breaking the connection tapes or wires linking the parallel resistor to the transmission line;

the first circuit may comprise circuit elements responsible for matching the impedance of the first diode relative to the first output of the first division means and for allowing the biasing of the terminals of the first diode with no resistor in series on one or other of these terminals;

the first circuit may comprise quarter-wavelength bias circuits comprising a first transmission line of high characteristic impedance (relative to 50Ω), of a length equal to the quarter-wavelength, of which a first end is connected to the line supplying the first diode and a second end is connected, on the one hand, to a second transmission line of low characteristic impedance (relative to 50Ω), of a length equal to the quarter-wavelength, and terminated by an open circuit, and on the other hand, to one of the bias ports of the first circuit;

the first circuit may comprise several quarter-wavelength bias circuits cascaded so as to increase the insulation of the bias ports of the first circuit relative to the first fraction of the input signal.

The invention also proposes a solid state power amplification device fitted with a predistortion linearization device of the type described above.

Because of its principle based on a modified self-biasing mechanism with two diodes (direct voltage and current), the invention is compatible with operation over a broad band of frequencies. Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWING

The present invention is illustrated by way of example, and not by limitation, in the figures of the accompanying drawings, wherein elements having the same reference numeral designations represent like elements throughout and wherein.

The appended drawings may not only serve to supplement the invention, but may also contribute to its definition as appropriate.

The object of the invention is to propose a predistortion linearization device (or linearizer) D responsible for achieving gain and phase expansions of form (or appearance or else shape) and of amplitude that can be adjusted as a function of an input microwave signal.

As is very schematically illustrated in FIG. 1, a linearizer D according to the invention may for example be an item of equipment designed to be connected upstream of the input of an amplification device AP (hereinafter called an amplifier), for example of the TWTA (Travelling Wave Tube Amplifier) type or of the "solid state" (or SSPA for Solid State Power Amplifier") type. But, in a variant illustrated schematically in FIG. 2, a linearizer D according to the invention may form a portion of an amplification device AP', (hereinafter called linearized amplifier), for example of the solid state power amplifier type. In this case, the amplifier AP' also comprises an amplification module MAP upstream of which a linearizer D according to the invention is connected.

The amplifier AP or AP' may for example be designed to amplify a channel in the output section of a telecommunications satellite. In this case, the microwave signals of the various channels are usually amplified separately before being multiplexed.

Furthermore, the amplifier AP and the associated linearizer D, or else the linearized amplifier AP', may form part of an item of equipment called an MPM (for Microwave Power Module), jointly with a direct voltage/current generator (or EPC for Electronic Power Conditioner).

By convention, in what follows, first a microwave (RF) electronic signal, digital or analogue, that supplies the input of a linearizer D according to the invention, is called the "input signal Se", secondly, a microwave (RF) electronic signal delivered at the output of a linearizer (linearization device) D according to the invention, and supplying the input of an amplifier AP or of an amplification module MAP of a linearized amplifier AP', is called the "intermediate signal Si" and thirdly, a microwave (RF) electronic signal delivered at the output of an amplifier AP or of an amplification module MAP of a linearized amplifier AP' is called the "output signal Ss".

Figure 1:
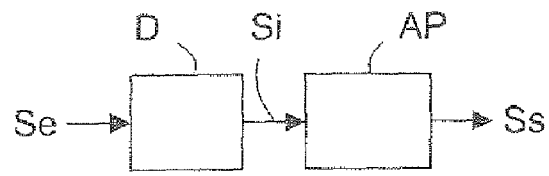
FIG. 1 illustrates very schematically an association of a linearization device according to the invention and an amplification device, for example of the TWTA (Travelling Wave Tube Amplifier) type.
Figure 2:
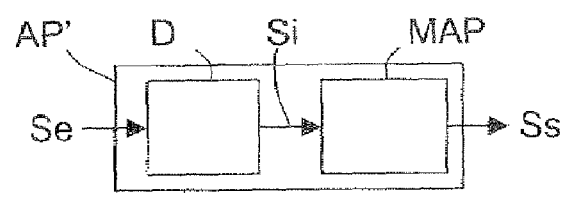
FIG. 2 illustrates very schematically an amplification device according to the invention, for example of the solid state power amplifier type, incorporating a linearization device.

In what follows, it is considered as a non-limiting example that the linearizer D is connected to an amplifier AP, as illustrated in FIG. 1.

Figure 3:
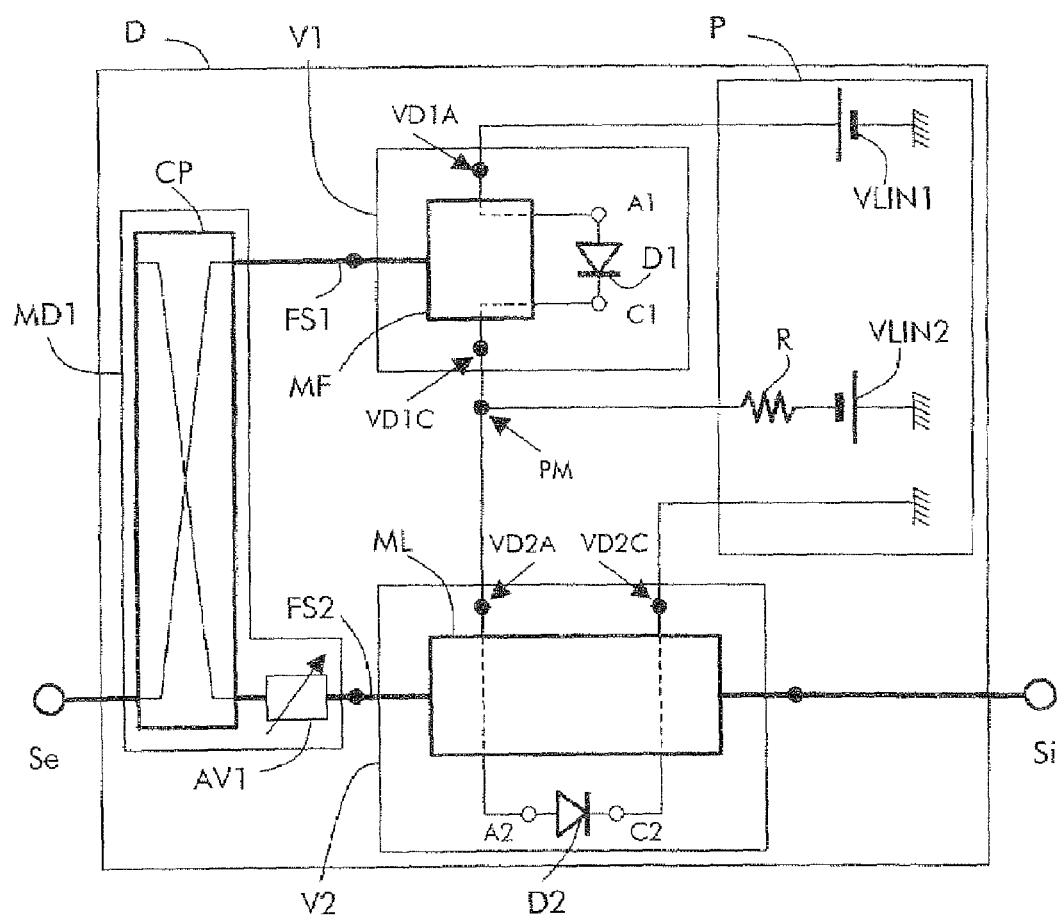
FIG. 3 illustrates in a schematic and functional manner a first exemplary embodiment of a linearization device according to the invention.

As is schematically and functionally illustrated in FIG. 3, a linearizer D according to the invention comprises at least a first division module MD1, a first V1 and second V2 channels and a bias circuit P.

It will be noted that in FIGS. 3, 10, 11 and 12, the thick lines materialize the paths taken by the microwave signals, while the thin lines materialize the paths taken by the direct currents.

The first division module MD1 is responsible for dividing (or separating) a microwave (RF) input signal Se that it receives on an input into first FS1 and second FS2 fractions that it delivers respectively to first and second outputs. The complementary values of these first FS1 and second FS2 fractions can be adjusted as required. As will be seen below, these values make it possible to partially fix the appearances (or forms or shapes) and amplitudes of the gain and phase expansion curves of the linearizer D.

As illustrated in FIG. 3, the first division module MD1 may for example consist of a 1×2 coupler CP (if necessary of the 3 dB/3 dB type, or 50%/50%), responsible for dividing the power of the input signal Se into two substantially equal portions, and a variable attenuator AV1 placed downstream of at least one of the two outputs of the coupler CP and responsible for diminishing by a chosen quantity (adjustable if necessary) the value of the power delivered by this output of the coupler CP. Therefore, the first division module MD1 delivers to first and second outputs respectively first FS1 and second FS2 fractions that are different (here FS1>FS2).

It will be noted that the first division module MD1 may be arranged in forms that are different from that illustrated in a non-limiting manner. Therefore, the variable attenuator AV1 may be made from active elements such as amplifiers cascaded with controllable attenuators, or directly from variable gain amplifiers. The variable attenuator AV1 may also have a behaviour that is non-uniform and adjustable as a function of the frequency.

The first channel V1 is connected to the first output of the first division module MD1, in order to be supplied by the first fraction FS1 of the input signal Se. It is responsible for generating a first direct current from a first self-biasing of a first diode D1 as a function of the first fraction FS1 of the input signal Se.

The second channel V2 is connected to the second output of the first division module MD1, in order to be supplied by the second fraction FS2 of the input signal Se. It is responsible for achieving gain and phase expansions at a port (Si) forming the output of the second channel V2 and of the device D from a second self-biasing of at least one second diode D2 as a function of the second fraction FS2 of the input signal Se.

The bias circuit P is connected and supplies with direct voltages the first V1 and second V2 channels. It makes it possible to combine into one and the same circuit, in an opposing manner, the direct voltages and currents originating from the first and second self-biasings of the first V1 and second V2 channels so as to control the shape of the gain and phase expansions of the second channel V2 as a function of the amplitude of the input signal Se.

The bias circuit P comprises a first direct voltage generator G1 responsible for delivering a first direct supply voltage VLIN1, a resistor R and a second direct voltage generator G2 responsible for delivering a second direct supply voltage VLIN2.

In the example illustrated in FIG. 3, the first channel V1 comprises at least a first diode D1 and a first circuit MF.

The first circuit MF is responsible for supplying at least a first diode D1 with the first fraction FS1 of the input signal Se, while supplying two ports VD1A and VD1C insulated from this first fraction FS1 of the input signal Se and making it possible to directly apply direct voltages respectively to the terminals A1 and C1 of the first diode D1.

In the example illustrated in FIG. 3, the second channel V2 comprises at least one second diode D2 and a second circuit ML.

The second circuit ML is responsible for supplying at least one second diode D2 with all or part of the second fraction FS2 of the input signal Se in order to convert the impedance variation of this second diode D2 as a function of this second fraction FS2 of the input signal Se into gain and phase expansions at the port (Si) that forms the output of the second channel V2 and of the device D while supplying two other ports VD2A and VD2C insulated from the second fraction FS2 of the input signal Se and making it possible to directly apply direct voltages respectively to the terminals A2 and C2 of the second diode D2.

In the example illustrated in FIG. 3, the first direct voltage generator G1 (of the bias circuit P) is connected to the terminal A1 of the first diode D1 through the port VD1A, and the second direct voltage generator G2 (of the bias circuit P) is connected simultaneously through the resistor R (that has a large value (typically of approximately 250Ω to 5 kΩ)) to a common node PM formed of the terminal C1 of the first diode D1 through the port VD1C and of the terminal A2 of the second diode D2 through the port VD2A. The terminal C2 of the second diode D2 is connected through the port VD2C to earth from the point of view of the direct voltage at the same time as it is earthed from the microwave point of view.

Because of the assembly shown above, the diode D2 is biased so that, in case of an increase in the power of the second fraction FS2 of the input signal Se, the current ID2 that it generates increases. If reference is made to the electric diagram of FIG. 4, which is the equivalent in direct voltage and current (DC) of the diagram of FIG. 3, it will be understood that the control voltage VD2 is given by the formula VD2=R*(ID1−ID2)−VLIN2. The increase of the current ID2 therefore causes a reduction of the portion of the current ID1 that traverses the resistor R. Consequently, when the current ID2 increases, the control voltage VD2 is reduced in a controlled manner under the self-biasing action of the diode D1. The diodes D1 and D2 therefore make opposing contributions to the self-biasing mechanism, so that it is possible to qualify the latter as "dual".

When the power PFS1 of the first fraction FS1 of the input signal Se is greater than the power PFS2 of the second fraction FS2 of the input signal Se (PFS1>PFS2), then the direct current ID1 leaving the first diode D1 is greater than the direct current ID2 leaving the second diode D2 (ID1>ID2). The direct current ID1 travels mainly into the resistor R. When the direct current ID2 increases because the power PFS2 increases, a portion of the current ID1 is directed towards the second channel V2 instead of going to the resistor R, thereby making it possible to reduce the self-biasing of the first diode D1, hence to reduce the increase in the voltage VD2 at the terminals of the second diode D2 as a function of the increase in power PFS2, hence to modify the microwave behaviour of the second diode D2 as a function of this power PFS2 and hence to control the variation of the gain and phase expansions of the second channel V2 as a function of the said power PFS2.

Figure 5:
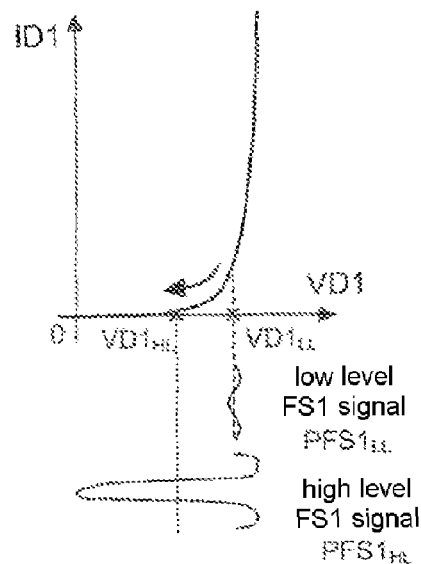
FIG. 5 is a diagram illustrating an example of the current/voltage characteristic of the first diode (D1) of the first channel of the linearization device of FIG. 3.

FIG. 5 represents schematically a diagram illustrating an example of a current (ID1)/voltage (VD1) characteristic of the first diode D1. The voltage $VD1_{HL}$ represents the value of the direct voltage at the terminals of the first diode D1 when the microwave signal FS1 is high level (that is to say when its power is maximal ($PFS1_{HL}$)), while the voltage $VD1_{LL}$ represents the value of the direct voltage at the terminals of the first diode D1 when the microwave signal FS1 is low level (that is to say when its power is minimal ($PFS1_{LL}$)). As the arrow indicates, it is clearly verified in the example illustrated that, under the action of the self-biasing mechanism, the direct voltage VD1 at the terminals of the first diode D1 decreases when the direct current ID1 increases, that is to say when the first fraction FS1 of the input signal Se increases.

Figure 6:
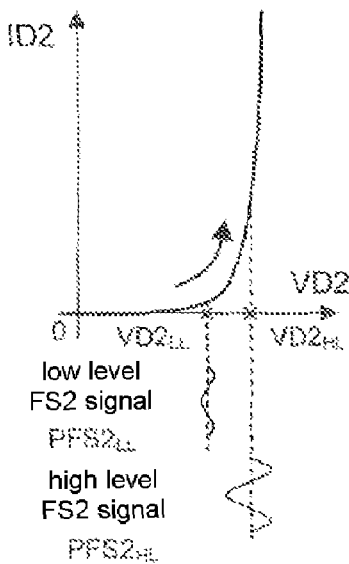
FIG. 6 is a diagram illustrating an example of the current/voltage characteristic of the second diode (D2) of the second channel of the linearization device of FIG. 3.

FIG. 6 shows schematically a diagram illustrating an example of a current (ID2)/voltage (VD2) characteristic of the second diode D2. The voltage $VD2_{HL}$ represents the value of the direct voltage at the terminals of the second diode D2 when the microwave signal FS2 is high level (that is to say when its power is maximal ($PFS2_{HL}$)), while the voltage $VD2_{LL}$ represents the value of the direct voltage at the terminals of the second diode D2 when the microwave signal FS2 is low level (that is to say when its power is minimal ($PFS2_{LL}$)). As the arrow indicates, it is clearly verified in the illustrated example that, under the action of the dual self-biasing mechanism, the direct voltage VD2 at the terminals of the second diode D2 increases when the direct current ID2 increases, that is to say when the second fraction FS2 of the input signal Se increases. It is important to note that the diagrams illustrated in FIGS. 5 and 6 are correlated in real time.

Figure 7:
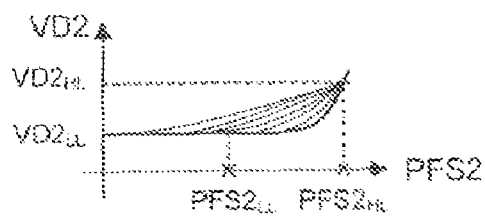
FIG. 7 is a diagram illustrating an example of the evolution of the voltage at the terminals of the second diode (D2) of the second channel of the linearization device of FIG. 3, as a function of the power of the second fraction of the input signal, for various values of ratio between the powers of the first and second fractions of the input signal.

FIG. 7 shows schematically a diagram illustrating an example of the evolution of the control voltage VD2 as a function of the power PFS2 of the second fraction FS2 on the input signal Se, for different values of the ratio between the powers PFS1 and PFS2 of the first FS1 and second FS2 fractions of the input signal Se (and at constant control voltages VLIN1 and VLIN2). As can be seen, by adjusting the value of the ratio PFS1/PFS2, the appearance of the curve of evolution of the voltage VD2 is modified as a function of the power PFS2.

Figure 8:
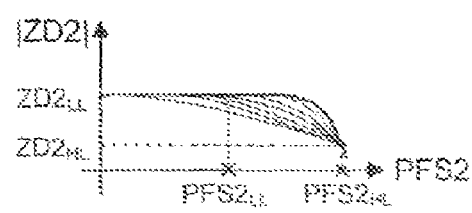
FIG. 8 is a diagram illustrating an example of the evolution of the modulus of the impedance at the terminals of a second diode (D2) of the second channel of the linearization device of FIG. 3, as a function of the power of the second fraction of the input signal, for various values of the ratio between the powers of the first and second fractions of the input signal.

FIG. 8 also shows schematically a diagram illustrating an example of the evolution of the impedance module ZD2 shown in microwave frequency by the second diode D2 as a function of the power PFS2 of the second fraction FS2 of the input signal Se for various values of the ratio between the powers PFS1 and PFS2 of the first FS1 and second FS2 fractions of the input signal Se (and at constant control voltages VLIN1 and VLIN2). Since the impedance module ZD2 varies in a manner substantially opposite to the direct voltage VD2, it is possible to state that, by adjusting the value of the ratio PFS1/PFS2, the appearance of the curve of evolution of the impedance ZD2 is modified as a function of the power PFS2. These modifications of appearance then induce modifications of the same type of the appearances (or forms or shapes) and amplitudes of the gain and phase expansion curves of the linearizer D.

It is important to note that the diagrams illustrated in FIGS. 7 and 8 are a consequence in real time of the example of evolution illustrated in FIGS. 5 and 6. Furthermore, it is also important to note that the diagrams illustrated in FIGS. 5, 6, 7 and 8 reflect one and the same non-linear phenomenon with three different locations of the device D.

Figure 9:
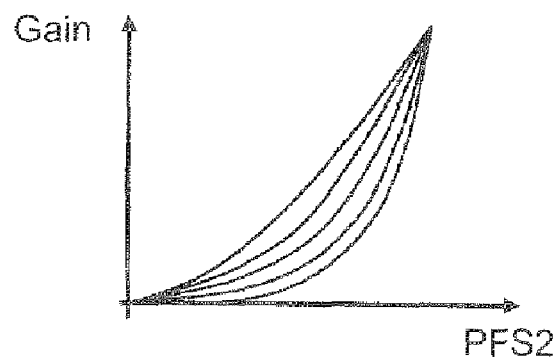
FIG. 9 is a diagram illustrating an example of the evolution of the gain expansion as a function of the power of the second fraction of the input signal, for various values of the ratio between the powers of the first and second fractions of the input signal.

An example of the evolution of the form (or shape) of the gain extension as a function of the power PFS2 of the second fraction FS2 of the input signal Se, for various values of the ratio between the powers PFS1 and PFS2 of the first FS1 and second FS2 fractions of the input signal Se (and at constant control voltages VLIN1 and VLIN2), is schematically illustrated in FIG. 9. The same type of evolution may be traced for the phase expansion as a function of the power PFS2 of the second fraction FS2 of the input signal Se. It is important to note that the diagram illustrated in FIG. 9 is a consequence of the examples of the evolution illustrated in FIGS. 5 to 8.

In summary, the form (or shape) of the gain and phase expansions of the device D as a function of the power PSe of the input signal Se supplying the first division module MD1 is adjusted according to two parameters:

the ratio (PFS1/PFS2) of the powers of the first FS1 and second FS2 fractions of the input signal Se: the higher the incident power on one of the two diodes D1 and D2, the higher the direct current generated by this diode, and the greater its contribution, the values of the direct voltages VLIN1 and VLIN2: typically, the parameter VLIN1+VLIN2 (with the orientation of the second generator G2 illustrated in FIG. 3) favours the contribution of the first diode D1 when VLIN1+VLIN2 is of low value, leading to an increasing gain characteristic (Gain=f(PSe)) and phase characteristic (Phase=f(PSe)) of the quadratic type. Conversely, for a higher value of the parameter VLIN1+VLIN2, it is the contribution of the second diode D2 that becomes predominant, the gain characteristic (Gain=f(PSe)) and phase characteristic (Phase=f(PSe)) expand and become more of the exponential type, the diode D2 opposing, for low input power values PSe, the increase in the control voltage VD2.

Figure 4:
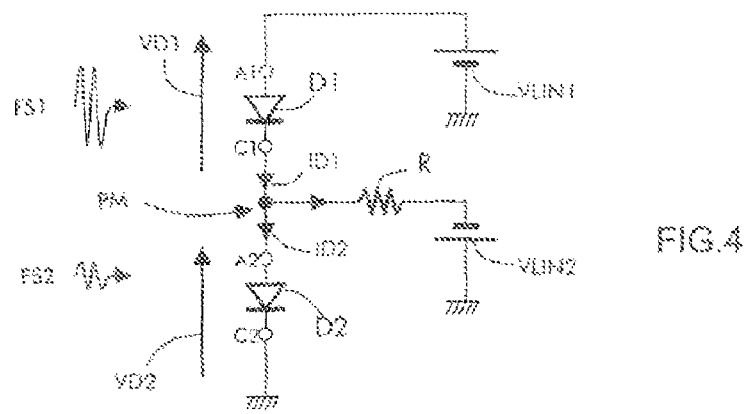
FIG. 4 illustrates the electric diagram in direct voltage and current (DC) equivalent to the linearization device of FIG. 3.

Because of this behaviour offered by the dual self-biasing electric diagram illustrated in FIG. 4, the linearization device D according to the invention may be used as a variable-shape predistortion linearization circuit.

Figure 10:
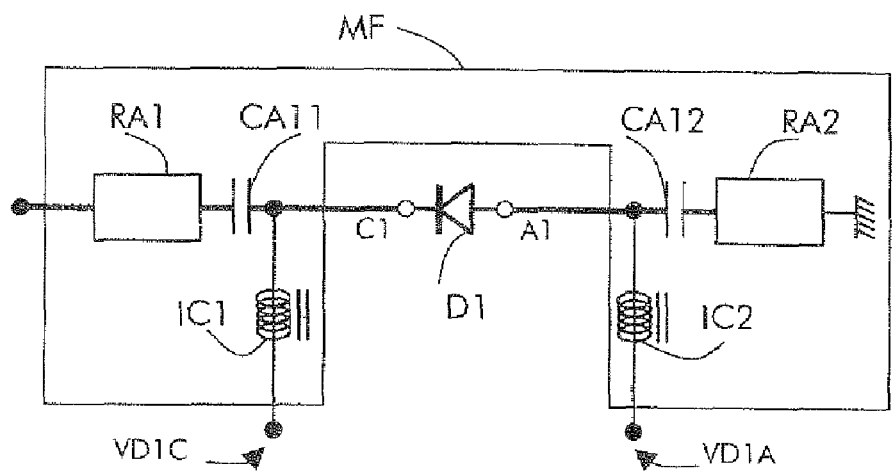
FIG. 10 illustrates an electric diagram equivalent to an exemplary embodiment of the first channel of the linearization device of FIG. 3.

In the non-limiting example of FIG. 10, the first connection means MF comprise first CA11 and second CA12 capacitive link elements, first IC1 and second IC2 impact inductive elements, and first RA1 and second RA2 impedance matching circuits.

The first impedance matching circuit RA1 comprises a first terminal connected to the first output of the first division module MD1 and a second terminal connected to the first capacitive link element CA11. The second terminal of the capacitive element CA11 is connected to the first terminal (cathode) C1 of the first diode D1. The second terminal (anode) A1 of the first diode D1 is connected to the second capacitive link element CA12 that is itself connected to earth by its second terminal through the second matching circuit RA2. First IC1 and second IC2 impact inductive element, connected respectively to the first C1 and second A1 terminals of the first diode D1, make it possible to bias the first diode D1 while disconnecting the microwave signals from the bias circuit P. Conversely, the first CA11 and second CA12 capacitive link elements make it possible for the microwaves to traverse the first diode D1 while blocking the direct currents generated by the self-biasing of the first diode D1 so that they pass exclusively into the bias circuit P through the first IC1 and second IC2 impact inductive elements. The first RA1 and second RA2 matching circuits serve, for their part, to match the impedance presented by the first diode D1 with the port impedance of the first output of the first division module MD1.

Figure 11:
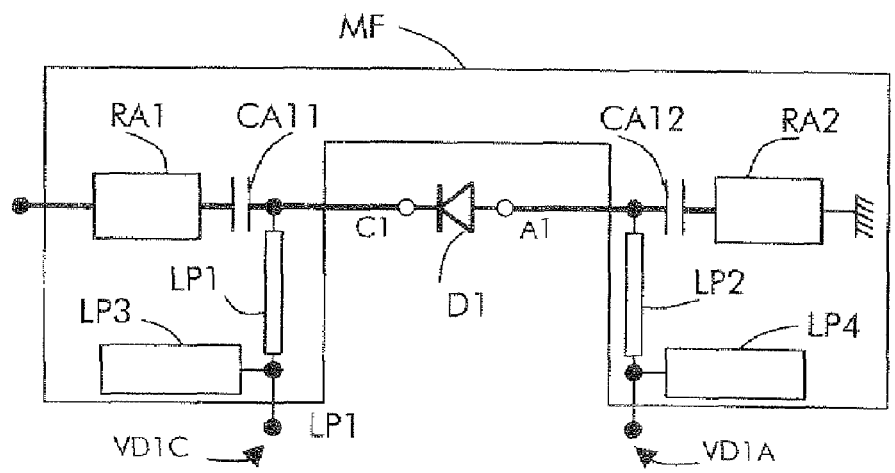
FIG. 11 illustrates an electric diagram equivalent to a second exemplary embodiment of the first channel of the linearization device of FIG. 3.

In a first variant embodiment of the first channel V1, the first IC1 and second IC2 impact inductive elements may be replaced by a bias circuit with two line sections λ/4, as illustrated in FIG. 11.

It will be noted that, when the conversion device D is a linearizer, the second channel V2 performs the linearization function. It is in the form of a microwave circuit whose transfer function in transmission has a gain expansion and a phase variation as a function of its input power thanks to the use of the second diodes D2 as variable impedance. Consequently, the second diodes D2 are used both as diodes intervening in the dual self-biasing mechanism, but also directly as variable non-linear impedance for the linearization function. The dual self-biasing procures for the second diodes D2 a singular behaviour relative to a conventional self-biasing mechanism. Specifically, since the direct control voltage VD2 rises with the input power PSe, the second diodes D2 have an impedance that varies in a particular manner as a function of the input power PSe (see FIG. 8).

Figure 12:
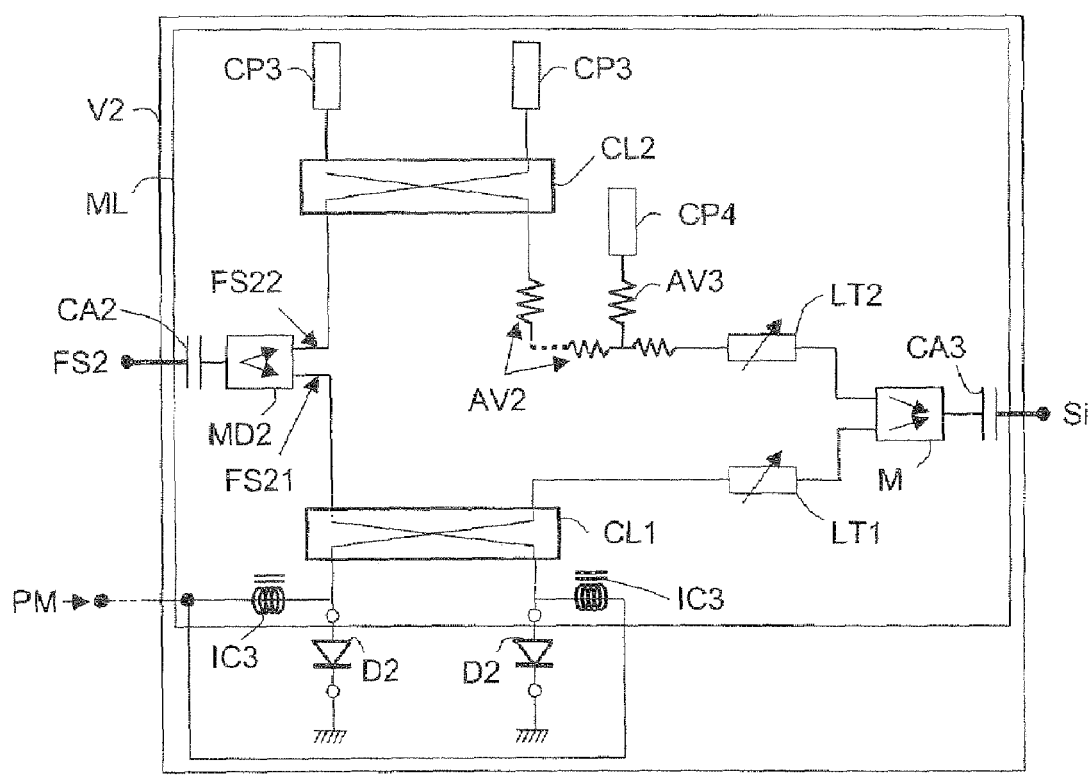
FIG. 12 illustrates in a schematic and functional manner an exemplary embodiment of the second channel of a linearization device according to the invention.

FIG. 12 illustrates a second exemplary embodiment of the second channel V2 of a conversion device D dedicated to linearization. This second channel here performs a linearization function called a "vectorial recombination" function, similar to that described in patent document EP 1320190. This exemplary embodiment is particularly well-suited to applications requiring a broad band of frequencies.

In this second example, the second connection means ML comprise a first capacitive link element CA2 (optional), a second division module MD2, first and second sub-channels, a combination module MC, and a second capacitive link element CA3 (optional).

The first capacitive link element CA2 comprises a first terminal connected to the second output of the first division module MD1 and a second terminal connected to the input of the second division module MD2. It is responsible for disconnecting the direct current that is generated by the self-biasing of the second diodes D2, so as to allow only the second fraction FS2 of the input signal Se to pass.

The second capacitive link element CA3 comprises a first terminal connected to the output of the combination module MC and a second terminal defining the output terminal of the second channel V2. It is responsible for disconnecting the direct current that is generated by the self-biasing of the second diodes D2, so as to allow only the microwave signal resulting from the device D to pass.

The second division module MD2 is responsible for dividing (or separating) the second fraction FS2 of the input signal Se that it receives on an input connected to the second output of the first division module MD1, into first FS21 and second FS22 sub-fractions that it delivers respectively to first and second outputs. The complementary values of these first FS21 and second FS22 sub-fractions are preferably identical (50%/50%). The first output of the second division module MD2 is connected to the first sub-channel in order to supply it with the first sub-fraction FS21 of the input signal Se. The second output of the second division module MD2 is connected to the second sub-channel in order to supply it with the second sub-fraction FS22 of the input signal Se.

This second division module MD2 may for example be in the form of a 0° Wilkinson coupler of the 1×2 type.

The first sub-channel (lower portion of FIG. 12) is called non-linear. It comprises two impact inductive elements IC4 (optional), a first coupler (preferably of the Lange coupler type) CL1, and a transmission line LT1 of adjustable length (optional).

The first coupler CL1 (preferably a Lange coupler) comprises four ports. The first and second ports are each connected to earth via a second diode D2 and are biased by the direct voltage generator G2 through the resistor R at the mid-point (node) PM. Each second diode D2 is for example in the form of a diode of the Schottky type between the terminals A (anode) and C (cathode) from which a current ID2 flows. The two second diodes D2 are preferably identical.

In the non-limiting example illustrated, the anode A of each second diode D2 is connected not only to the first or second port of the first Lange coupler CL1, but also, from the point of view of the direct currents and voltages, to the mid-point PM via an impact inductive element IC4. The impact inductive elements IC4 are responsible for disconnecting the microwaves, so as to allow only the direct current to pass. These impact inductive elements IC4 may be in the form of inductors or bias circuits with two line sections $\lambda/4$ and may be positioned at different locations on the second channel V2 because these elements have a high impedance capable of blocking the microwaves (and therefore do not disrupt the operation of the microwave circuits) and because the direct current can supply the second diodes D2.

The third port of the first coupler CL1 is connected to the first output of the second division module MD2 (that delivers the first sub-fraction FS21 of the input signal Se).

The fourth port of the first coupler CL1 is connected (directly or indirectly) to the first input of the combination module MC. In the non-limiting example illustrated, this connection is made via a transmission line LT1 of a length that can be adjusted so as to allow the modification of the group propagation delay of the first sub-channel. Therefore, it is possible to adjust the combination phase of the signals, originating from the first and second sub-channels and supplying the combination module MC, in a non-uniform manner as a function of the frequency.

The second sub-channel (upper portion of FIG. 12) is called linear. It comprises at least two passive components CP3 and a second coupler (preferably of the Lange coupler type) CL2.

The second coupler CL2 also comprises four ports. The first and second ports are each connected to earth via a passive component CP3. Each passive component is for example a section of microwave transmission line in open circuit and of adjustable length and width (or stub). Thanks to such stubs of adjustable length and width, it is possible to vary the phase of the microwave signals of the second sub-fraction FS22 in a uniform manner as a function of the frequency.

The third port of the second coupler CL2 is connected to the second output of the second division module MD2 (which delivers the second sub-fraction FS22 of the input signal Se).

The fourth port of the second coupler CL2 is connected preferably indirectly to the second input of the combination module MC. In the non-limiting example illustrated, this connection is made via variable attenuators AV2 and AV3 and a transmission line LT2 of adjustable length mounted in series.

The variable attenuators AV2 are for example formed of resistive elements that are distributed in series or in parallel, preferably along the second sub-channel, and that may or may not be short-circuited by a tape or a metal wire so as to vary their attenuation from 0 dB to 0.5 dB, or even a few dB, for example.

The variable attenuators AV3 are for example formed of resistive elements that are distributed in parallel, preferably along the second sub-channel, and that may or may not be connected via a tape or a metal wire to the transmission line of the second sub-channel so as to vary their attenuation from 0 dB to 0.5 dB, or even a few dB, for example. The earthing of the resistive element AV3 is then achieved by a section of transmission line CP4 of the stub type of length $\lambda/4$ and terminated by an open circuit.

The transmission line LT2 makes it possible to modify the group propagation delay of the second sub-channel. Therefore, it is possible to adjust the combination phase of the signals, originating from the first and second sub-channels and supplying the combination module MC, in a non-uniform manner as a function of the frequency.

It will be noted that it is not obligatory for both of the sub-channels to comprise a transmission line LT1 or LT2 of adjustable length. Only one of them may in effect be fitted with a transmission line of this type. These transmission lines LT1 and/or LT2 may allow the first and second sub-channels to have the same group propagation delay. Therefore, the recombination phase of the first and second sub-channels may be constant over the whole of a frequency band, so that the response of the linearizer D is constant over this same band. Conversely, the transmission lines LT1 and/or LT2 may allow the first and second sub-channels to voluntarily have a different group propagation delay. It should be noted that, in this case, the recombination phase between the first and second sub-channels is then a linear function of the frequency in the payload band of the linearizer D, whose slope is determined by the lengths of the transmission lines LT1 and LT2. This adjustment of recombination phase that differs according to the frequency is, in this case, used to give the linearizer D a non-uniform behaviour as a function of the frequency, capable of compensating for the variation of the gain and phase compression of the power amplifier AP, AP' as a function of the frequency. Travelling wave tube amplifiers or TWTAs specifically have variations signifying their gain and phase compressions on the frequency bands conventionally used on satellite payloads, for example. The first CL1 and second CL2 (Lange) couplers are preferably identical in order to ensure by construction one and the same group propagation delay for the first and second sub-channels.

The combination module MC is responsible for combining the microwave signals processed and delivered by the first and second sub-channels in order to form the intermediate signal Si. It may for example be in the form of a 0° Wilkinson coupler of the 2×1 type.

Naturally, the conversion device D may comprise embodiments of first MF and/or second ML connection means other than those described above with reference to FIGS. 10 to 12.

The conversion device D according to the invention and/or the amplification device AP or AP' according to the invention may be produced in the form of electronic circuits that may be integrated.

The invention is not limited to the embodiments of the conversion device and amplification device, which have been described above only as an example, but covers all the variants that those skilled in the art can envisage in the context of the following claims.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalent thereof.

The invention claimed is:

1. A predistortion linearization device with gain and phase expansions to compensate for the gain compression and phase variation of a power amplifier, comprising:
first division means comprising an input capable of receiving a microwave input signal and first and second outputs arranged to deliver first and second fractions chosen from said input signal,
a first channel connected to said first output in order to be supplied by said first fraction of the input signal, and arranged to generate a first direct current from a first self-biasing of a first diode as a function of said first fraction of the input signal,
a second channel connected to said second output in order to be supplied by said second fraction of the input signal, and arranged to carry out gain and phase expansions at a port forming an output from a second self-biasing of at least one second diode as a function of the second fraction of the input signal, and
a bias circuit connected to, and supplying with direct voltages, said first and second channels, and arranged to combine, in an opposing manner, the direct voltages and currents originating from the first and second self-biasings of the first and second channels so as to control the shape of the gain and phase expansions of the second channel as a function of the amplitude of the input signal.

2. The device according to claim 1, said first channel comprises a first circuit connected to said first output of the first division means and arranged to supply at least a first diode with the first fraction of said input signal and to supply two ports that are insulated from said first fraction of the input signal and making it possible to directly apply direct voltages respectively to the terminals of said first diode.

3. The device according to claim 1, wherein said second channel comprises a second circuit connected to said second output of the first division means and arranged to supply at least one second diode with at least a portion of said second fraction of said input signal in order to convert an impedance variation of said second diode as a function of said second fraction of the input signal into gain and phase expansions at a port defining an output, and to supply two other ports that are insulated from said second fraction of the input signal and making it possible to directly apply direct voltages respectively to the terminals of said second diode.

4. The device according to claim 2, wherein said bias circuit comprises a first direct voltage generator connected to one terminal of said first diode through said port, and a second direct voltage generator connected simultaneously through a resistor to a common node formed of the other terminal of the first diode through one port of the first channel and of one terminal of the terminals of said second diode through one port of the second channel, the other terminal of said second diode being connected, through the other port of said second channel, to earth from the point of view of the direct voltage.

5. The device according to claim 1, wherein the direction of said first and second diodes may be simultaneously inverted.

6. The device according to claim 1, wherein said first division means comprise a coupler arranged to divide the power of said input signal into two portions, and an element placed downstream of at least one of the two outputs of the coupler and responsible for amplifying or attenuating by a chosen and adjustable quantity the value of the power delivered by each of the two outputs of said coupler, so that said first division means deliver to the first and second outputs respectively said first and second chosen adjustable fractions of said input signal.

7. The device according to claim 6, wherein said element is chosen from a group comprising a variable attenuator element, an amplifier element, a variable gain amplifier element, and an element linking in cascade several of the functions of the other elements of said group.

8. The device according to claim 6, wherein said element has a behaviour that is non-uniform and adjustable as a function of the frequency.

9. The device according to claim 3, wherein said second circuit forms a diode-based linearization circuit whose direct bias ports comprise no resistor in series with said diode or diodes.

10. The device according to claim 9, wherein said linearization circuit comprising:
second division means comprising an input connected to said second output of the first division means and first and second outputs arranged to deliver first and second chosen sub-fractions of said second fraction of the input signal,
combination means comprising first and second inputs and an output capable of delivering output signals resulting from the combination of the signals received on its first and second inputs, a non-linear first sub-channel, comprising a first coupler having first and second ports each connected to earth via at least one second diode supplied with direct voltage and current by the second generator through the resistor at the node, a third port connected to the first output of the second division means, and a fourth port coupled to said first input of the combination means, and a linear second sub-channel, comprising a second coupler substantially identical to said first coupler in order to ensure by construction the same group propagation delay for said first and second sub-channels and comprising first and second ports each connected to earth via third passive components, a third port connected to the second output of the second division means, and a fourth port coupled to said second input of the combination means.

11. The device according to claim 10, wherein said third passive components are sections of microwave transmission line in open circuit, of adjustable length and width so as to adjust the combination phase of the signals in said combination means, in a substantially constant manner across a whole chosen frequency band.

12. The device according to claim 10, wherein at least one of the first and second sub-channels comprises a transmission line of adjustable length, so as to modify the group propagation delay of its sub-channel to adjust the combination phase of the signals in said combination means, in a non-constant manner as a function of the frequency, so that said linearizer has a different behaviour as a function of the frequency on a broad band of frequencies so as to follow the frequency variations of the power amplifier to be linearized.

13. The device according to claim 10, wherein at least one of said first and second sub-channels comprises at least one resistor etched in series or in parallel on the transmission line playing the role of attenuator of an attenuation value that is adjustable between a finite value and zero by short-circuiting said series resistor by means of a tape or of at least one metal wire and by breaking the connection tapes or wires linking said parallel resistor to the transmission line.

14. The device according to claim 2, wherein said first circuit comprises circuit elements arranged to match the impedance of said first diode relative to said first output of the first division means and to allow the biasing of the terminals of said first diode with no resistor in series on one or other of these terminals.

15. The device according to claim 2, wherein said first circuit comprises quarter-wavelength bias circuits comprising a first transmission line of high characteristic impedance, of a length equal to the quarter-wavelength, of which a first end is connected to the line supplying said first diode and a second end is connected, on the one hand, to a second transmission line of low characteristic impedance, of a length equal to the quarter-wavelength, and terminated by an open circuit, and on the other hand, to one of the bias ports of said first circuit.

16. The device according to claim 2, wherein said first circuit comprises several quarter-wavelength bias circuits cascaded so as to increase the insulation of the bias ports of said first circuit relative to the first fraction of said input signal.

17. A solid state power amplification device, comprising a predistortion linearization device according to claim 1.

18. The device according to claim 2, wherein said second channel comprises a second circuit connected to said second output of the first division means and arranged to supply at least one second diode with at least a portion of said second fraction of said input signal in order to convert an impedance variation of said second diode as a function of said second fraction of the input signal into gain and phase expansions at a port defining an output, and to supply two other ports that are insulated from said second fraction of the input signal and making it possible to directly apply direct voltages respectively to the terminals of said second diode.

19. The device according to claim 3, wherein said bias circuit comprises a first direct voltage generator connected to one terminal of said first diode through said port, and a second direct voltage generator connected simultaneously through a resistor to a common node formed of the other terminal of the first diode through one port of the first channel and of one terminal of the terminals of said second diode through one port of the second channel, the other terminal of said second diode being connected, through the other port of said second channel, to earth from the point of view of the direct voltage.

20. The device according to claim 2, wherein said first division means comprise a coupler arranged to divide the power of said input signal into two portions, and an element placed downstream of at least one of the two outputs of the coupler and responsible for amplifying or attenuating by a chosen and adjustable quantity the value of the power delivered by each of the two outputs of said coupler, so that said first division means deliver to the first and second outputs respectively said first and second chosen adjustable fractions of said input signal.

21. The device according to claim 4, wherein said second circuit forms a diode-based linearization circuit whose direct bias ports comprise no resistor in series with said diode or diodes.

22. The device according to claim 6, wherein said second circuit forms a diode-based linearization circuit whose direct bias ports comprise no resistor in series with said diode or diodes.

23. The device according to claim 11, wherein at least one of the first and second sub-channels comprises a transmission line of adjustable length, so as to modify the group propagation delay of its sub-channel to adjust the combination phase of the signals in said combination means, in a non-constant manner as a function of the frequency, so that said linearizer has a different behaviour as a function of the frequency on a broad band of frequencies so as to follow the frequency variations of the power amplifier to be linearized.

24. The device according to claim 3, wherein said first circuit comprises quarter-wavelength bias circuits comprising a first transmission line of high characteristic impedance, of a length equal to the quarter-wavelength, of which a first end is connected to the line supplying said first diode and a second end is connected, on the one hand, to a second transmission line of low characteristic impedance, of a length equal to the quarter-wavelength, and terminated by an open circuit, and on the other hand, to one of the bias ports of said first circuit.

25. The device according to claim 4, wherein said first circuit comprises quarter-wavelength bias circuits comprising a first transmission line of high characteristic impedance, of a length equal to the quarter-wavelength, of which a first end is connected to the line supplying said first diode and a second end is connected, on the one hand, to a second transmission line of low characteristic impedance, of a length equal to the quarter-wavelength, and terminated by an open circuit, and on the other hand, to one of the bias ports of said first circuit.

* * * * *